(12) United States Patent (10) Patent No.: US 6,400,624 B1
Parker et al. (45) Date of Patent: Jun. 4, 2002

(54) CONFIGURE REGISTERS AND LOADS TO TAILOR A MULTI-LEVEL CELL FLASH DESIGN

(75) Inventors: Allan Parker, Austin; Joseph Skrovan, Buda, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/794,479

(22) Filed: Feb. 26, 2001

(51) Int. Cl.[7] .............................................. G11C 29/00
(52) U.S. Cl. .................... 365/201; 365/189.12; 365/63; 365/195; 365/185.17; 365/185.22; 365/185.03
(58) Field of Search ........................... 365/201, 189.05, 365/189.12, 195, 63, 185.17, 185.03, 185.19, 185.2, 185.22

(56) References Cited

U.S. PATENT DOCUMENTS

| | | | | |
|---|---|---|---|---|
| 5,831,900 A | * | 11/1998 | Miyamoto | 365/185.03 |
| 6,166,979 A | * | 12/2000 | Miyamoto | 365/219 |
| 6,236,602 B1 | * | 5/2001 | Patti | 365/201 |
| 6,289,047 B1 | * | 9/2001 | Agazzi et al. | 375/232 |

OTHER PUBLICATIONS

James Eldridge, "Filing in a Flash", IEEE Spectrum, Oct. 1993, pp. 53–54.*
"Flash Memory Goes Mainstream", Dipert et al, Intel Corp., IEEE Spectrum Oct. 1993, pp. 48–52.
"64 Megabit Mass Storage Flash Memory–Utilizing Ultranand Technology",Am30LV0064D, AMD–Utilizing UltraNAND Product Brief, Oct. 6, 2000, pp. 1–41.

* cited by examiner

Primary Examiner—Andrew Q. Tran

(57) ABSTRACT

A method for testing a multi-level memory includes storing multi-level data in a plurality of memory cells of the multi-level memory and reading from configure registers initial values of a plurality of performance variables. The performance variables set operating parameters of the multi-level memory. The method further includes during a first test phase operating the multi-level memory at the initial values of the plurality of performance variables and reading program values of the plurality of performance variables. During a second test phase, the multi-level memory is operated at the program values of the plurality of performance variables.

18 Claims, 3 Drawing Sheets

CONFIGURE REGISTERS AND LOADS TO TAILOR A MULTI-LEVEL CELL FLASH DESIGN

BACKGROUND

The present invention relates generally to memory devices. More particularly, the present invention relates to a descending staircase read technique for a multi-level cell NAND flash memory device.

A variety of semiconductor memory devices have been developed for storage of information. Examples include volatile and nonvolatile memory. Nonvolatile memory provides a key advantage in that it retains stored data after power is removed from the device. One example of nonvolatile memory is flash memory. However, manufacture and operation of nonvolatile memory is generally more complex than for volatile memory. For all memory devices, important design goals include increased storage density and reduced read and write times.

A conventional memory device includes an array of storage cells or memory cells. Each cell stores a single binary digit or bit of information. For example, in a flash memory, the threshold voltage of a transistor in the memory cell is adjusted according to the data stored. During a read cycle, the threshold voltage is sensed to resolve the state of the data stored. In a conventional binary memory, this data is conventionally described as having a state of logic 0 or logic 1. The array of storage cells is surrounded by circuits for reading and writing data and controlling operation of the memory device.

Recently, multi-level cell memories have been developed. Multi-level storage refers to the ability of a single memory cell to store or represent more than a single bit of data. A multi-level cell may store 2, 4, 8 . . . etc., bits in a single storage location. Multi-level storage is achieved by storing charge on a floating gate of a memory cell to establish a threshold voltage Vt level for the cell from among three or more possible threshold voltages. The actual Vt produced will fall within a program distribution with some allowed tolerance still providing reliable operation.

In any memory, there are several internal parameters can affect program distributions. Examples include: program pulse count, or the number of signal pulses that must be applied to a memory cell to program the cell to a selected level; program pulse width, or the time duration of signal pulses which program the cell; read verify reference current, or the current used as a reference when resolving the stored state of the memory cell; program inhibit voltage and read pass voltage. Such parameters are referred to herein as performance variables, although once established they may not vary but instead remain constant.

All of these performance variables and more can be tuned to optimize reading, writing and verifying performance of the memory device. Optimization is required because of variations in device performance as a result of manufacturing tolerances and because of product variation over the lifetime of the product. Optimization may be required at various times over the operating life of the memory device. Initial optimization based on simulation and design is hard wired using metallization of the memory integrated circuit.

In conventional devices, two techniques have been used to generate these various settings. The first technique involves metal options for the integrated circuit. Metal masks may be changed or the silicon connections may be post-processed after most or all of the conventional masking steps to optimize performance variables. These metal option methods are time consuming and are generally not reversible, so that re-optimization later is not possible. There is no test flexibility with these metal options, so that a performance variable may be programmed once at one test condition (operating voltage, temperature, etc.) with no opportunity to adjust the performance variable at another test condition. Many memory devices must be prepared and tested to examine interaction of variables. With a large number of performance variables, it is impossible to investigate a full design matrix.

A second technique has been used to generate performance variables in flash memory devices involves the use of content addressable memory or CAM cells consisting of a single flash memory cell. CAM cells are flexible and may be repeatedly programmed and erased, overcoming the chief limitation of metal options. However, CAM cells introduce a significant die size penalty. Each CAM cell must have its own high voltage circuit to generate the necessary program and erase voltages. Further, programming and erasing of memory cells requires significant time and increases testing complexity. In conventional designs, all CAM cells are erased together, meaning that the old state must be stored to return to default settings.

Accordingly, there is a need for an improved method for storing and updating performance variables in an integrated circuit such as a flash memory device.

BRIEF SUMMARY

By way of introduction only, a method for testing a multi-level memory includes storing multi-level data in a plurality of memory cells of the multi-level memory and reading from configure registers initial values of a plurality of performance variables. The performance variables set operating parameters of the multi-level memory. The method further includes during a first test phase operating the multi-level memory at the initial values of the plurality of performance variables and reading program values of the plurality of performance variables. During a second test phase, the multi-level memory is operated at the program values of the plurality of performance variables.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
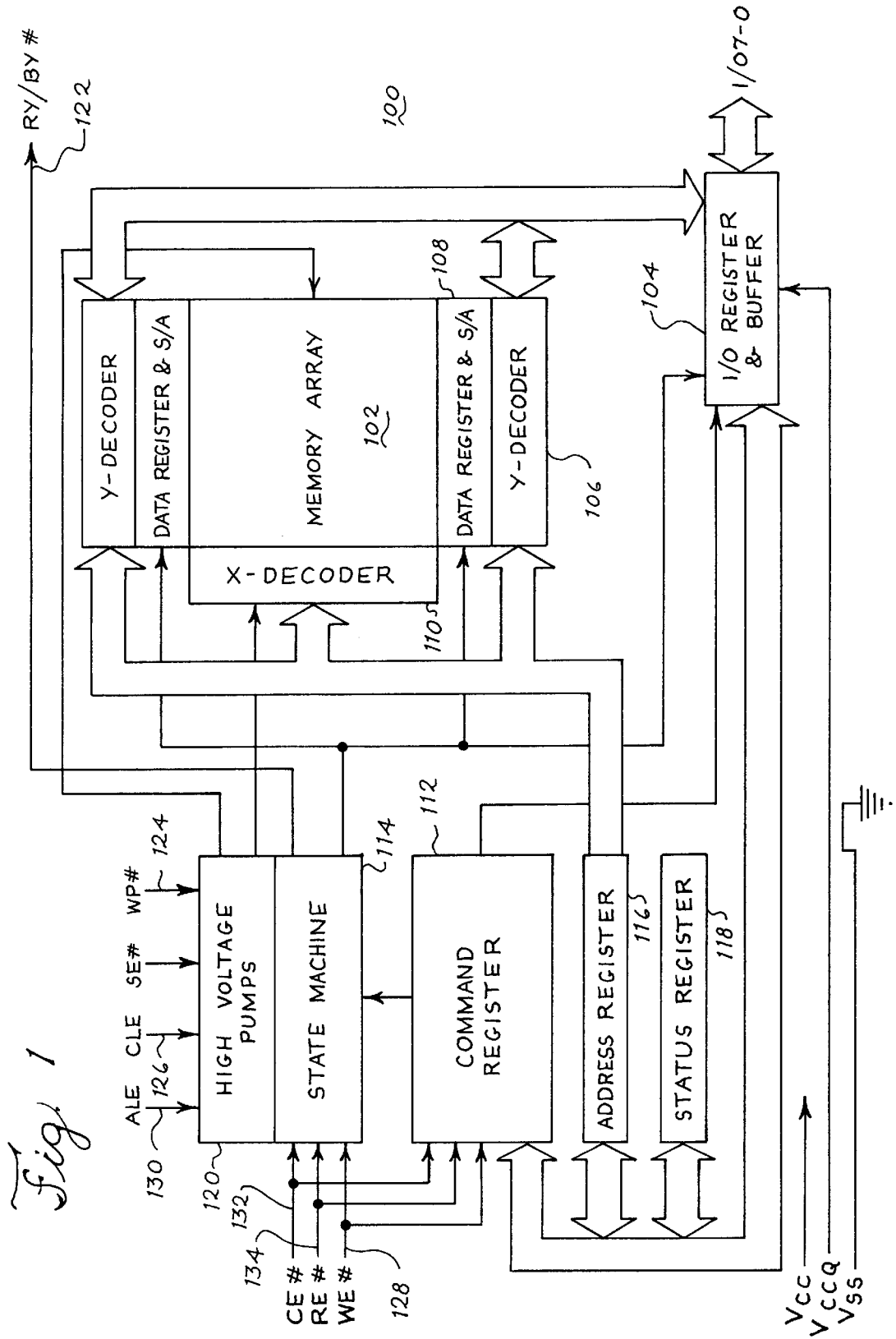
FIG. 1 is a block diagram of a memory device.

Referring now to the drawing, FIG. 1 shows a block diagram of a memory device 100. The memory device 100 in the illustrated embodiment is a NAND flash memory. However, in other embodiments, the memory device 100 may be any other suitable type of volatile memory such as random access memory (RAM) including static or dynamic RAM or nonvolatile memory such as EEPROM. Further, the memory device 100 may be an embedded memory circuit within another integrated circuit or device containing other circuitry, such as logic. As a flash memory, the memory device 100 may be written or programmed with data, read to retrieve the stored data, and erased to clear the memory device on a block-by-block basis.

In the illustrated embodiment, the memory device 100 includes a memory cell array 102, an input/output (I/O) register 104, one or more Y-decoders 106, one or more sense amplifier blocks 108 and one or more X-decoders 110. Further, the memory device 100 includes a command register 112, a state machine 114, an address register 116, a status register 118 and a high voltage circuit 120. Other embodiments of the memory device 100 may include other components or omit some of those illustrated in FIG. 1.

The memory cell array 102 includes a plurality of memory cells arranged in an ordered array of rows and columns. Each memory cell is independently addressable and may be programmed or written with data and read or sensed. In response to a received address, the X-decoder 110 selects one or more rows of the memory cell array 102 for access. Similarly, the Y-decoder 106 selects one or more columns of the memory cell array 102 for access. Sense amplifiers in the sense amplifier block 108 detect the state of the data stored in the accessed memory cell or cells. Data registers of the sense amplifier block 108 store data immediately prior to writing or immediately after reading the accessed memory cell or cells.

Address information and data to be stored, along with commands for controlling operation of the memory device 100, are provided to the memory device 100 using the I/O register 104 in a time multiplexed manner known in the art. Commands are written to the command register 112 using the I/O register 104. Address information corresponding to one or more memory cells to be accessed is stored in the address register 116. Status information is stored in the status register 118. Register contents serve as inputs to the state machine 114 which controls read, erase and programming of the memory device 100. The state machine 114 performs embedded operations to complete reading, erasing and programming automatically without user interaction.

Reading data is done according to standard NAND flash operation. A starting address is provided to the I/O register 104 along with the appropriate command. The associated memory cells are accessed and a page of data is transferred to the I/O register 104. A page may be any suitable size, such as 264 bytes. The 264 bytes in this example includes 256 bytes of storage area and 8 bytes of spare area. After an initial page read access time, such as 6 microseconds, the memory device 100 under control of the state machine 114 automatically increments the address register to the next address location in response to a received clock signal.

Erasing operations are performed on a block basis. A block may be any suitable size, such as 16 rows by 256 words per row. The state machine 114 initiates an embedded erase algorithm to automatically time erase pulse widths and verify proper cell erase margin.

The memory device 100 signals completion of an operation such as a read, write or erase using a read/busy pin 122. The signal at the ready/busy pin 122 indicates operation status of the memory device 100. When this signal is high, the memory device 100 is ready to accept commands and data for a next operation. When the signal at the pin 122 is low, an internal operation is in progress.

To complete the identification of elements shown in FIG. 1, the high voltage circuit 120 generates the voltages necessary for proper reading, programming and erasure of the memory device 100. The memory device 100 operates in response to power supply (Vcc and Vccq) and ground (Vss) voltages. Typical power supply voltage is 3.0 volts, but other voltages may be used.

A write protect input pin 124 provides hardware data protection. When a write protect signal is asserted at pin 124, program and erase operations are inhibited.

A command latch enable (CLE) pin 126 receives a signal which controls activation of the command register 112 for the receipt of commands. When this signal is high, the command is latched into the command register 112 on the rising edge of the write enable signal received at the write enable pin 128. A signal at an address latch enable (ALE) input 130 controls activation of the address register 116 during a data input operation. When the ALE signal is high, the address information is latched on the rising edge of the write enable signal at pin 128. When ALE is low, the input data information is latched on the rising edge of the write enable signal. The signal at the chip enable input 132 controls the mode, either active or standby, of the memory device 100. The signal at the read enable input 134 controls serial data output and status from the input/output lines. Lastly, the signal at the spare area enable input 136 controls access to a spare storage area on each page. When the spare area signal is high, the spare area is not enabled.

The memory device 100 stores several internal parameters which affect performance of the memory. Examples of such parameters include: program pulse count, or the number of signal pulses that must be applied to a memory cell to program the cell to a selected level; program pulse width, or the time duration of signal pulses which program the cell; read verify reference current, or the current used as a reference when resolving the stored state of the memory cell; program inhibit voltage and read pass voltage. Such parameters are referred to herein as performance variables. In one embodiment, these parameters are stored in the state machine 114. In other embodiments, these parameters are stored elsewhere in the memory device and their reading, programming and erasing is under control of one or more control circuits. Further details will be provided below in conjunction with FIG. 4.

Figure 2:
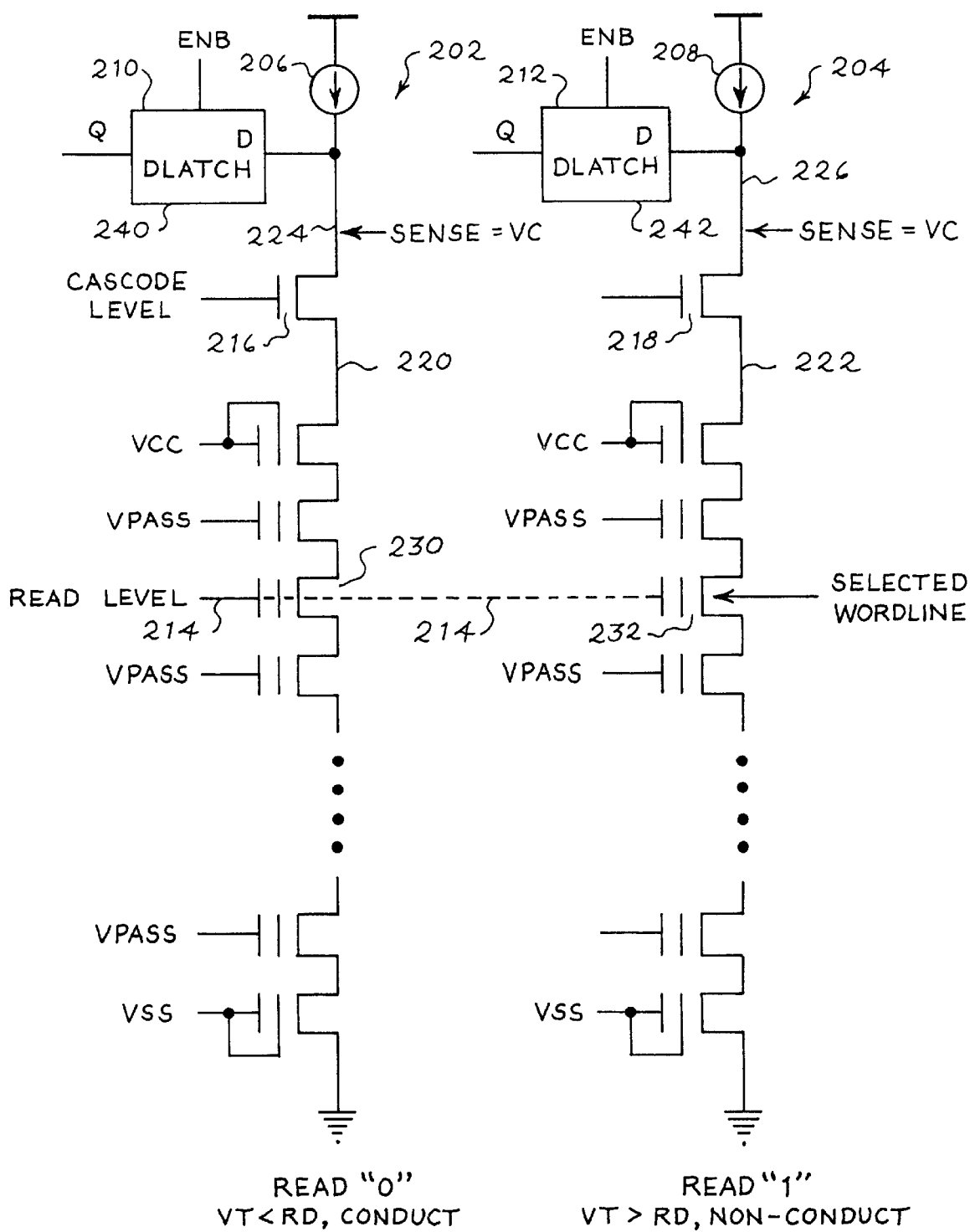
FIG. 2 is a simplified block diagram illustrating a read operation in the memory device of FIG. 1.

FIG. 2 is a simplified block diagram illustrating a read operation in the memory device of FIG. 1. FIG. 2 shows two columns including a first column 202 and a second column 204 of the memory cell array 102. Each column 202, 204 includes a column current source 206, 208, respectively, bit line buffer logic 210, 212 respectively, a cascode transistor 216, 218, and a plurality of memory cells.

The cascode transistors 216, 218 have respective sources coupled to the bit lines 220, 222, respectively, and respective drains coupled to the sense lines 224, 226. The gates of the cascode transistors 216, 218 are coupled to a reference potential. The cascode transistors 216, 218 form cascode amplifiers to amplify the current in the bit line due to a selected memory cell for sensing at the sense lines 224, 226.

As noted above in connection with FIG. 1, the memory cells are arranged in an array of rows and columns. In a typical embodiment, there are 16 memory cells per column and 264 memory cells per row. Memory cells are further organized in pages, blocks and sectors. The rows are interconnected by word lines including a word line 214 shown in FIG. 2.

As illustrated schematically in FIG. 2, each memory cell of the flash memory includes a floating gate for storage of charge. By controlling the charge stored on the floating gate, the threshold voltage of the memory cell is adjusted. When the voltage on the word line is raised above the threshold voltage of the memory cell, the memory cell transistor conducts current. For reading the data stored in a selected memory cell, other transistors in the column are supplied with a voltage Vpass so that these transistors act as pass transistors, conducting the current sunk in the memory cell to the bit lines 220, 222. This current is amplified by the cascode transistors 216, 218.

Two examples of reading data are illustrated in FIG. 2. In column 202, transistor 230 is selected by driving the word line 214 to a read voltage. This same voltage is applied to all memory cells coupled to the word line 214, such as transistor 232 in column 204. In the memory cell 230, the threshold voltage Vt of the cell is less than the applied read voltage (RD). Therefore, the memory cell 230 will conduct a read current on the order of a few microamps. This current in the bit line 220 is amplified by the cascode transistor 216 and the sense line 224 is pulled low to a voltage of approximately Vss. The bit line buffer circuitry 210, embodied here as a D latch 240, will store the state of the sense line 224 and the data may be read from the latch 240.

In column 204, the threshold voltage Vt of the memory cell 232 is greater than the applied read voltage (RD) on the word line 214. As a result, the memory cell 232 will conduct substantially no current. With no current in the bit line 222, the voltage on the sense line 226 remains high or approximately Vcc. Again, the bit line buffer circuitry 210 is embodied as a D latch 242 which stores the state of the sense line 226 for subsequent reading.

Figure 3:
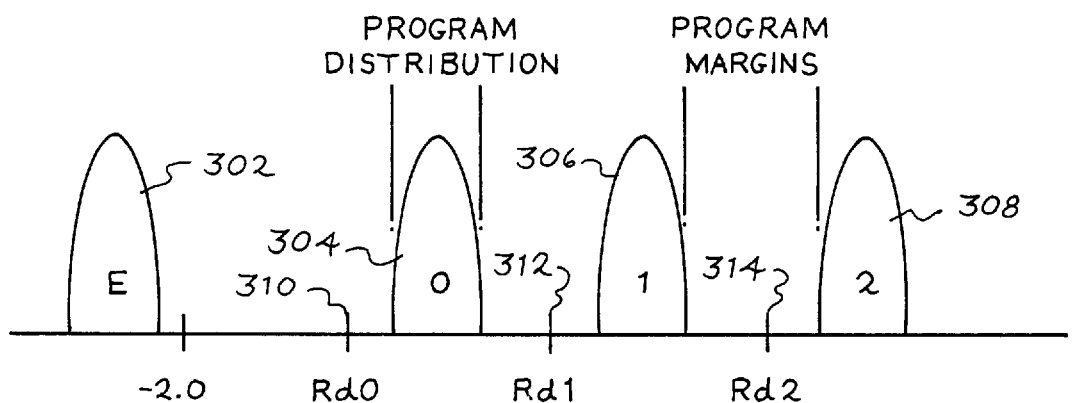
FIG. 3 illustrates relative threshold voltage levels for storing data in a multi-level memory cell of the memory device of FIG. 1.

FIG. 3 illustrates relative threshold voltage levels for storing data in a multi-level memory cell of the memory device of FIG. 1. In the example of FIG. 3, the number of bits stored per cell is N=2 so the number of possible threshold voltage values is 2 to the power of N or 4. It is recognized that during the programming operation, a programmed threshold voltage in a given memory cell will actually fall within a program level voltage distribution of voltages about a nominal or mean voltage. Thus, the example threshold voltage levels are shown as four program level voltage distributions. The distributions and their associated data states are as shown in FIG. 3. The erased data state or E has the most negative programmed threshold voltage in a distribution 302 so that erased memory cells will always conduct when their associated word line is selected or driven to a relatively high voltage level. A data state of 0 has the next highest programmed threshold voltage, in a distribution 304. A data state of 1 has the next highest programmed threshold voltage, in a distribution 306. A data state of 2 has the highest programmed threshold voltage, in a distribution 308.

FIG. 3 also illustrates the program margins between the individual program voltages. It is to be noted that FIG. 3 is exemplary only for the case where the multi-level memory cell stores N=4 possible levels. The programmed threshold voltages and distributions for other implementations involving other possible stored levels will vary from those shown in FIG. 3. The table below indicates how these levels can be decoded into logical bits.

| Level | Vt | Accessed Logical Bits Q2 | Q1 |
|---|---|---|---|
| 2 | 2.0 V | 0 | 0 |
| 1 | 1.0 V | 0 | 1 |
| 0 | 0 V | 1 | 0 |
| E | <−2.0 V | 1 | 1 |

FIG. 3 further shows the read levels required to resolve the data stored in a given memory cell. A first read level 310 labelled Rd0 is used to discriminate the stored 0 data from an erased state. That is, a voltage Rd0 is applied to the word line of the memory cell to be sensed. If the memory cell stores an erased state E, the threshold voltage of the memory cell will be in the distribution 302 and therefore less than the applied voltage Rd0. The memory cell will conduct current. On the other hand, if the memory cell stores the data 0 state, the threshold voltage will be in the distribution 304 and therefore greater than the applied voltage Rd0. The memory cell will not conduct current or will conduct only leakage current. Similar conditions apply for using a read voltage Rd1 to discriminate the stored data 1 state, with a threshold voltage in the distribution 306, from the stored data 0 state with a threshold voltage in the distribution 304, and using a read voltage Rd2 to discriminate the stored data 2 state, with a threshold voltage in the distribution 308, from the stored data 1 state, with a threshold voltage in the distribution 306. In accordance with the present embodiments, a descending staircase read signal with levels substantially equal to voltage Rd2, Rd1 and Rd0 is applied to a selected memory cell to distinguish possible stored voltages in a memory cell.

Figure 4:
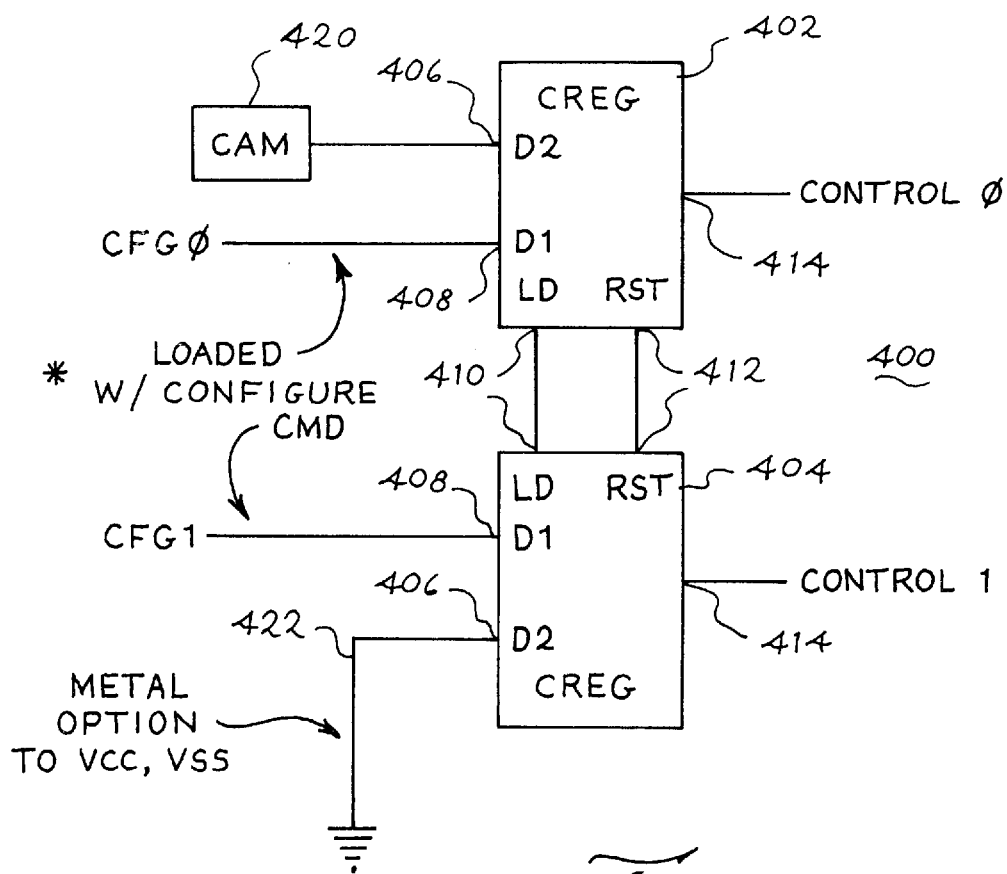
FIG. 4 illustrates configure registers for storing performance variable data in a multi-level memory cell.

FIG. 4 illustrates configure registers 400 for storing performance variable data in a multi-level memory cell. The configure registers 400 include a first configure register 402 and a second configure register 404. The circuit shown in the drawing is exemplary only. An integrated circuit such as a memory may include a large number of configure registers to establish performance variables for operating and testing the integrated circuit.

Each configure register 402, 404 includes a first data input 406 to receive a default value and a second data input 408 to receive a program value. Each configure register 402, 404 further includes a load input 410 to receive a load signal and a reset input 412 to receive a reset signal. The configure registers 402, 404 store the default value on power up or upon assertion of the reset signal at the reset input 412. Each configure register 402, 404 further includes a data output 414 to provide contents of the register 402, 404.

In the illustrated embodiment, the configure registers 402, 404 are shown as delay or D-type flip flops with dual data inputs and data load and reset capability. Design and implementation of such a configuration register is well within the purview of those ordinarily skilled in the art of CMOS circuit design. Further, any suitable data storage circuit may be fashioned to provide the functionality of the configure registers 402, 404. For example, a master-slave flip flop may be substituted, or the configure registers 402, 404 may be provided with other operational features such as hardware set, etc. Still further, the configure registers 402, 404 may be combined with combinatorial logic or timing or clocking signals or stored data to provide added flexibility. The configure registers form register means for storing data.

The configure registers 402, 404 in the illustrated embodiment are further combined with circuits to establish the default value. A non-volatile storage circuit, content addressable memory (CAM) cell 420, is coupled to the first data input 406 of configure register 402 to establish the default value. The CAM cell 420 may be programmed under control of a control circuit such as the state machine 114 of the memory device 100. The high voltage pumps 120 generate the necessary read, erase and program voltages to control the CAM cell 420. A single CAM cell 420 may be coupled to a large number of configure registers to provide default values of logic 0 or logic 1 to the configure registers.

Similarly, hardwired connection 422 is coupled between the first data input 406 of the configure register 404 and a predetermined voltage line to establish the default value. In FIG. 4, the predetermined voltage line is ground or Vss, the most negative supply potential in the memory device 100. Other voltage lines may be used, such as Vcc or the most positive supply potential or another voltage generated on-chip or off-chip.

Again, the drawing figure is exemplary only. A designer may choose to establish default values using only CAM cells or using only hardwired connections or by using any combination of the two. Further, either the default values or the program values may be established from any data source on the integrated circuit such as the state machine 114. The CAM cell 420 provides the advantage of being re-programmable following erasure. However, the CAM cell 420 and its associated high voltage circuitry take substantial real estate to implement. In contrast, the hardwired connection 422 is very small but is generally a one-time-only programming option.

The configure registers form a hybrid between the metal options such as hardwired connection 422 and CAM cells. The configure registers have the flexibility of the CAM cells but also provide the low overhead of the metal options.

The configure registers 402, 404 default to the settings established by the CAM cell 420 for the configure register 402 and hardwired connection 422 for the configure register 404. The default condition will be entered, for example, after execution of a reset operation or on power-up. When the integrated circuit receives a CONFIGURE LOAD command, for example, using the I/O register of the memory device of FIG. 1, the configure registers are overwritten with data at the data inputs 408.

The output signals from the data output 414 may be combined in any suitable manner to establish performance variables for the memory device or other circuit. For example, eight configure registers may be combined in parallel to define a byte-wide data value corresponding to a selected value of a performance variable of interest, such as the program pulse count. The state machine 114 may read this byte-wide value and determine the program pulse count to one of 256 resolution. In another example, the byte-wide value may be converted in a digital to analog conversion circuit to produce a signal such as a current or voltage.

By using a large number of configure registers and controlling selection of default or program values, many performance variables can be tested. A full matrix of settings can be analyzed on a single device to find a desired performance window. This can be especially important in a multi-level memory, where the program distributions illustrated in FIG. 3 must be precisely controlled and where other circuit parameters such as read current must correlate with the program distributions. Further, the configure registers can be used to control testing modes under different operating conditions, such as low or high Vcc supply voltage, low or high temperature, and so forth. Still further, the external system containing the memory device 100 could use the CONFIGURE LOAD command to set the memory device for various program performances and reliability needs. A list of specific load words could be provided from the manufacturer to the customer for different device needs. For example, loading a particular value in conjunction with the CONFIGURE LOAD command may set the reference current and the program voltage for a fast program operation.

Thus, a testing method for an integrated circuit such as a memory using configure registers such as those illustrated in the drawing includes initializing the integrated circuit, for example by resetting or applying operating power. This sets the configure registers to their default values which are established, for example, by the metal option or a CAM cell or by loading default data. The method further includes entering a test mode. In response to entry into the test mode, program values are stored in a plurality of configure registers. The program values are provided, for example, by the state machine or from an external source. In the example of FIG. 4, the program values are provided on the lines labeled CFG0 and CFG1. The program values are then read from the configure registers to establish values for performance variables such as program voltage, read verify reference current, and so on. The memory or other integrated circuit is then operated to determine its performance associated with those values of the performance variables. Subsequently, the reset signal can be asserted on the reset input 412 of the configure registers to reset the registers to default value. A next program signal can then be applied on program lines such as CFG0 and CFG1, to the configure registers 402, 404 or other similar registers, to establish a next test condition. This process can continue until a large number of test conditions have been evaluated.

From the foregoing, it can be seen that the present embodiments provide an improved method and apparatus for controlling on-chip values for testing and characterization. Configuration registers which are physically small and use little or no operating power are added to an integrated circuit to establish performance variables. By selectively programming or leaving defaulted various configuration registers, a user can characterize or optimize performance of the integrated circuit. In one particular application, the many interrelated signal levels required for reliable operation of a multi-level memory may be varied to characterize and optimize performance.

While a particular embodiment of the present invention has been shown and described, modifications may be made. For example, while an exemplary embodiment has been shown as a memory device, any integrated circuit may be configured as illustrated and described herein. It is therefore intended in the appended claims to cover all such changes and modifications which fall within the true spirit and scope of the invention.

What is claimed is:

1. A memory device comprising:
  operational circuitry operative in response to a performance variable; and
  one or more configure registers to store data related to the performance variable as one of a default value and a program value.

2. The memory device of claim 1 wherein the each configure register of the one or more configure registers comprises:
  a first data input to receive the default value;
  a second data input to receive the program value; and a load input to receive a load signal, the configure register storing the program value in place of the default value in response to the load signal.

3. The memory device of claim 2 wherein the configure register further comprises:
a reset input to receive a reset signal, the configure register restoring the default value in place of a stored program value in response to the reset signal.

4. The memory device of claim 1 wherein the performance variable comprises one of a program pulse count, a program pulse width, a read verify reference current, a program inhibit voltage and a read pass voltage.

5. The memory device of claim 1 wherein the one or more configure registers comprise sufficient registers to store a range of possible performance variable values for testing the memory device under varying operational conditions.

6. The memory device of claim 1 wherein the one or more configure registers comprise sufficient registers to store data related to a range of possible performance variable values for testing the memory device under varying operational conditions.

7. The memory device of claim 1 further comprising:
a hardwired connection between an input of a configure register of the plurality of configure registers and a predetermined voltage line to establish the default value of the performance variable.

8. The memory device of claim 1 further comprising:
a non-volatile storage circuit coupled to an input of a configure register of the plurality of configure registers to establish the default value of the performance variable.

9. The memory device of claim 1 further comprising:
testing circuitry configured to test performance of the memory device at values of the performance variable, the testing circuitry coupled to the one or more configure registers to receive one of the default value and the program value of the performance variable.

10. A testing method for an integrated circuit, the method comprising:
initializing the integrated circuit;
entering a test mode;
in response to entry into the test mode, storing program values in a plurality of configure registers;
reading the plurality of program values to establish values for performance variables; and
operating the integrated circuit to test performance at the established values of the performance variables.

11. The testing method of claim 10 wherein initializing the integrated circuit comprises:
powering up the integrated circuit; and
establishing default values in each configure register of the plurality of configure registers.

12. The testing method of claim 10 wherein entering a test mode comprises:
receiving a configure load command; and
generating a load signal for at least some of the plurality of configure registers; and
loading the at least some of the plurality of configure registers with the program values.

13. The testing method of claim 10 wherein operating the integrated circuit comprises:

establishing first values for a first set of performance variables from a first group of configure registers;
performing predetermined operations of the integrated circuit;
establishing second values for the first set of performance variables from a second group of configure registers;
performing the predetermined operations of the integrated circuit; and
comparing performance using the first values and performance using the second values.

14. The method of claim 13 further comprising:
establishing first values for a second set of performance variables from a third group of configure registers;
performing predetermined operations of the integrated circuit;
establishing second values for the second set of performance variables from a fourth group of configure registers;
performing the predetermined operations of the integrated circuit; and
comparing performance using the first values and performance using the second values.

15. A memory device comprising:
operating means for accessing data in the memory device;
testing means for testing select portions of the operating means under control of a performance variable, the testing means including storage means for storing one of a default value and a program value, and
decoding means for generating respective values of the performance variable in response to contents of the storage means.

16. The memory device of claim 15 wherein the storage means comprises:
register means for storing including a first data input means for receiving the program value in response to a load signal and second data input means for receiving the default value upon initialization of the storage means.

17. The memory device of claim 16 wherein the register means further comprises load input means for receiving the load signal and reset input means for receiving a reset input signal.

18. A method for testing a multi-level memory, the method comprising:
storing multi-level data in a plurality of memory cells of the multi-level memory;
reading initial values of a plurality of performance variables, the performance variables setting operating parameters of the multi-level memory;
during a first test phase, operating the multi-level memory at the initial values of the plurality of performance variables;
reading program values of the plurality of performance variables; and
during a second test phase, operating the multi-level memory at the program values of the plurality of performance variables.

* * * * *